(12) United States Patent
Hoshino et al.

(10) Patent No.: US 7,853,768 B2
(45) Date of Patent: Dec. 14, 2010

(54) ELECTRONIC CONTROL APPARATUS AND METHOD FOR WRITING BACKUP DATA IN ELECTRONIC CONTROL APPARATUS

(75) Inventors: Kazuya Hoshino, Isesaki (JP); Masato Yuzawa, Isesaki (JP)

(73) Assignee: Hitachi, Ltd., Tokyo (JP)

( * ) Notice: Subject to any disclaimer, the term of this patent is extended or adjusted under 35 U.S.C. 154(b) by 482 days.

(21) Appl. No.: 11/979,357

(22) Filed: Nov. 1, 2007

(65) Prior Publication Data
US 2008/0109623 A1 May 8, 2008

(30) Foreign Application Priority Data
Nov. 2, 2006 (JP) ............................ 2006-299531
Sep. 26, 2007 (JP) ............................ 2007-249147

(51) Int. Cl.
*G06F 12/00* (2006.01)
(52) U.S. Cl. ...................................... 711/162; 711/103
(58) Field of Classification Search .................. None
See application file for complete search history.

(56) References Cited

U.S. PATENT DOCUMENTS

| | | | |
|---|---|---|---|
| 5,530,673 A | * | 6/1996 | Tobita et al. ........... 365/185.09 |
| 5,862,083 A | * | 1/1999 | Tobita et al. ........... 365/185.09 |
| 5,973,964 A | * | 10/1999 | Tobita et al. ........... 365/185.33 |
| 6,078,520 A | * | 6/2000 | Tobita et al. ........... 365/185.09 |
| 6,275,436 B1 | * | 8/2001 | Tobita et al. ................. 365/221 |
| 6,421,279 B1 | * | 7/2002 | Tobita et al. .......... 365/189.011 |
| 6,735,117 B2 | * | 5/2004 | Ott ......................... 365/185.18 |
| 2002/0051394 A1 | * | 5/2002 | Tobita et al. ................. 365/221 |
| 2003/0003908 A1 | * | 1/2003 | McGrew et al. ............. 455/426 |
| 2004/0001359 A1 | * | 1/2004 | Ott ......................... 365/185.18 |

FOREIGN PATENT DOCUMENTS

JP        2002-082841 A        3/2002

* cited by examiner

*Primary Examiner*—Kevin Verbrugge
(74) *Attorney, Agent, or Firm*—Foley & Lardner LLP

(57) ABSTRACT

When a power switch is turned OFF, the execution of steady process is stopped, and backup data is written into a flash memory. If the power switch is turned ON during the writing of the backup data, the backup data writing execution is allowed to last for a predetermined time T1 after an instant when the power switch is turned ON, and if the writing of the backup data is not terminated at the time when the predetermined time T1 has elapsed, the writing of the backup data is interrupted so that the steady process is started for being executed.

15 Claims, 6 Drawing Sheets

ELECTRONIC CONTROL APPARATUS AND METHOD FOR WRITING BACKUP DATA IN ELECTRONIC CONTROL APPARATUS

BACKGROUND OF THE INVENTION

1. Field of the Invention

The present invention relates to an electronic control apparatus which comprises a rewritable nonvolatile memory, for writing backup data in the memory during self-shutoff process after a power switch is turned OFF, and a writing method of the backup data.

2. Description of the Related Art

Japanese Laid-open (Kokai) Patent Application Publication No. 2002-082841 discloses that, in an electronic control apparatus comprising a flash memory as an electrically rewritable nonvolatile memory, the writing of control data in the flash memory is executed during self-shutoff process after a key switch is turned OFF.

In the case where a starting process at the next time is demanded during the writing of data into the flash memory, the electronic control apparatus is preliminarily set so as to restart after the writing of data in the flash memory is terminated. However, in such a case, several problems might occur such that, for example, a delay in restarting of the electronic control apparatus brings about an unpleasant situation such that the apparatus cannot be in time for the start of running of a vehicle. On the other hand, if the writing is forcibly terminated in favor of the restart of the electronic control apparatus, in some cases, not only an abnormality might occur in the writing of data but also a memory chip might be adversely affected.

SUMMARY OF THE INVENTION

In view of the above problems, the present invention has an object to provide an electronic control apparatus, capable of shortening the restarting time if necessary, while suppressing the frequencies of forcible termination, by continuing or interrupting the writing process depending on the situation, and a method for writing the backup data.

In order to achieve the above object, according to the present invention, the writing of backup data into a rewritable nonvolatile memory is executed during self-shutoff process which is carried out after a power switch is turned OFF, and when the power switch is again turned ON during the writing of backup data, steady process corresponding to an the ON-state of the power switch is resumed.

The other objects, features and advantages of the invention will become understood from the following description with reference to the accompanying drawings.

DESCRIPTION OF THE PREFERRED EMBODIMENTS

Figure 1:
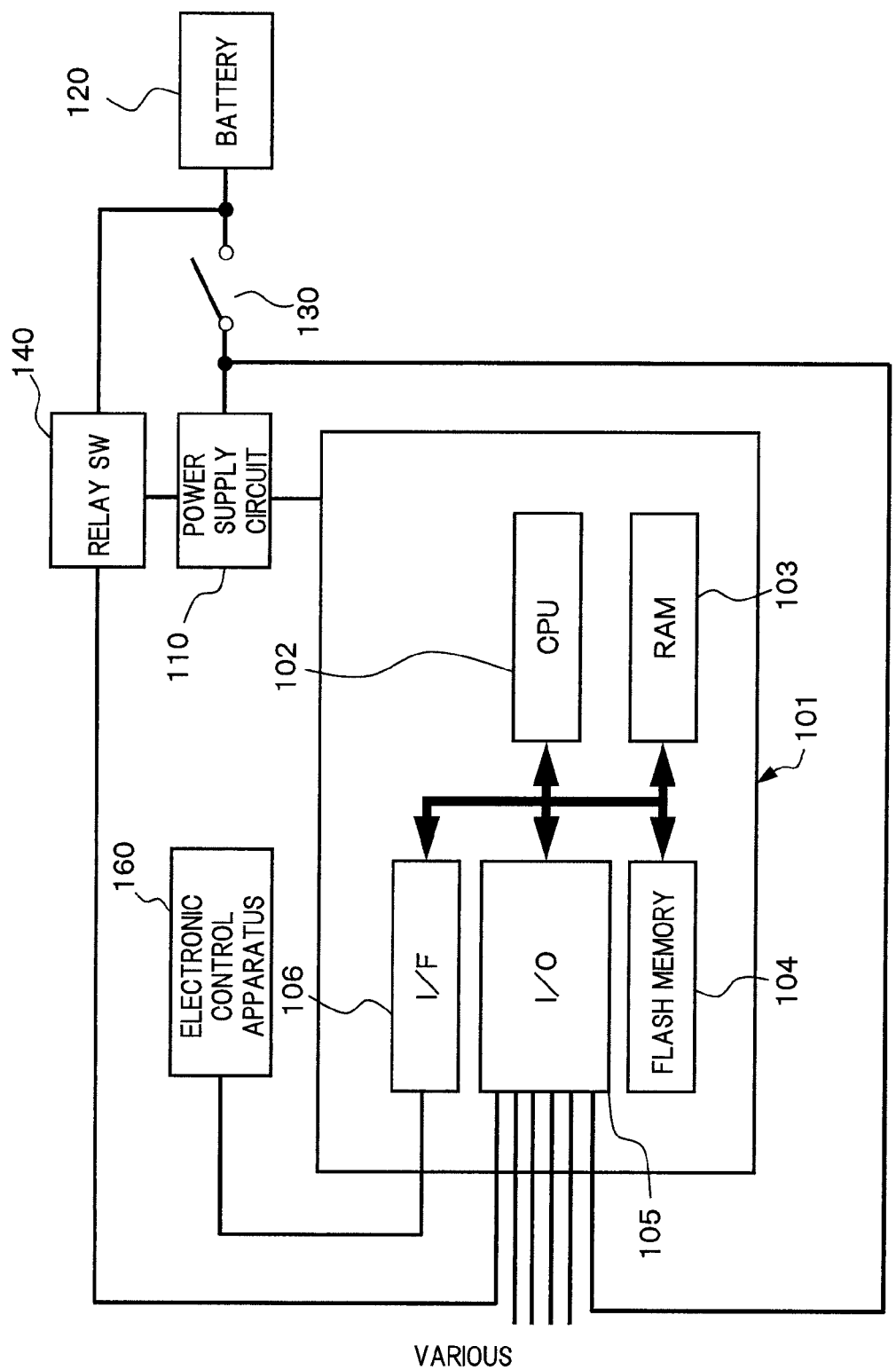
FIG. 1 is a circuit diagram of an electronic control apparatus according to an embodiment of the present application.

FIG. 1 is a circuit diagram showing an electronic control apparatus according to an embodiment of the present application. An electronic control apparatus 101 shown in FIG. 1 is used for controlling a vehicle engine (internal combustion engine).

Electronic control apparatus 101 (engine control microcomputer) for controlling the engine comprises a CPU 102, a RAM 103, a nonvolatile flash memory 104, an I/O 105 and a communication I/F 106.

Flash memory 104 (flash EEPROM) which is an electrically rewritable nonvolatile memory, stores previously therein a control program for controlling an engine fuel injection amount, fuel injection timing, ignition timing, an idle rotation speed and the like, and further, is used for saving backup data, such as learning data, failure diagnosis information and the like.

I/O 105 is disposed to receive therein detection signals from a crank angle sensor, a water temperature sensor, an air flow sensor and the like, and to output control signals to a fuel injection valve, an ignition power transistor for ignition, a self-shutoff relay switch 140 to be described later, and the like.

Electronic control apparatus 101 receives therein the power supply from a power source (battery) 120 via a power supply circuit 110.

Here, an ignition key switch 130 (power switch) is disposed between power source 120 and power supply circuit 110, and when ignition key switch 130 is turned ON, power source 120 and power supply circuit 110 are electrically connected to each other, so that a voltage of power source 120 is applied on electronic control apparatus 101.

Further, self-shutoff relay switch 140 is disposed to a circuit which connects power source 120 and power supply circuit 110 by bypassing ignition key switch 130. Accordingly, even if ignition key switch 130 is in an OFF-state, the voltage of power source 120 is applied on electronic control apparatus 101 if self-shutoff relay switch 140 is in an ON-state.

The ON/OFF of self-shutoff relay switch 140 is controlled based on the control signal outputted from electronic control apparatus 101.

Electronic control apparatus 101 receives therein an on/off signal for ignition key switch 130 via I/O 105. When ignition key switch 130 is turned, electronic control apparatus 101 turns self-shutoff relay switch 140ON, whereas, when ignition key switch 130 is turned OFF, electronic control apparatus 101 executes self-shutoff process of turning self-shutoff relay switch 140 OFF late after the turning-OFF operation of ignition key switch 130.

Further, electronic control apparatus 101 for controlling the engine is connected to another electronic control apparatus 160 via communication I/F 106 and a communication line, to be inter-communicable with another electronic control apparatus 160. Consequently, the intercommunication via communication I/F106 allows the plural electronic control apparatuses to share information therebetween and/or mutually monitors whether or not there is any occurrence of failure in the intercommunicating apparatus or apparatuses.

As another electronic control apparatus 160 described above, there is provided a unit for controlling an automatic transmission, a unit for controlling a variable valve mechanism which varies opening characteristics (a valve lift amount, valve timing and the like) of an intake/exhaust valve of the engine, or the like.

Electronic control apparatus 101 for controlling the engine turns self-shutoff relay switch 1400N when ignition key switch 130 is turned ON, and also, executes steady process of controlling the engine in accordance with the control program stored in flash memory 104, and writes the learning data and the failure diagnosis information obtained by the steady process in RAM 103.

RAM 103 is a volatile memory, and accordingly, does not store the memory content when the power supply is at shutoff. Therefore, when electronic control apparatus 101 stops the engine control (steady process) based on the control program when ignition key switch 130 is turned OFF, electronic control apparatus 101 executes backup process in which writing of data (backup data) necessary for being saved, such as the learning data, the failure diagnosis information and the like, which was before written in RAM 103, in flash memory 104 is executed during a time period until the power supply comes to the self-shutoff thereof.

Here, in a conventional technology, in the case where a next starting process is demanded during writing the data in the flash memory, the electronic control apparatus is set to restart after the writing of data in the flash memory is terminated.

At this time, in the case where the time required for the writing of data is increased due to time degradation of a memory chip, finally, the data writing is forcibly terminated after a standby time in standard specification of the memory chip. However, this standby time is too long for a vehicle control unit. Therefore, if the electronic control apparatus is set to restart after the writing of data into the flash memory is terminated, there may be problems in that another electronic control apparatus in the vehicle diagnoses the delay in restarting as an abnormality or in that the starting of the electronic control apparatus is not in time for the vehicle running start. Further, the delay in starting of the electronic control apparatus may bring discomfort to a vehicle driver. Here, if the writing is forcibly terminated in favor of the restarting of the electronic control apparatus, in some cases, not only an abnormality might occur in the writing of data but also the memory chip might be adversely affected.

Accordingly, it is desirable to shorten the time required for the restarting of the electronic control apparatus while avoiding the forcible writing termination as much as possible.

Here, there will be described the detail of the backup process executed by electronic control apparatus 101 in accordance with a flowchart of FIG. 2.

In a state where ignition key switch 130 is turned OFF so that the power supply to electronic control apparatus 101 is stopped (step S100), when ignition key switch 130 is turned ON so that the power is re-supplied to electronic control apparatus 101 (step S101), electronic control apparatus 101 executes the steady process of controlling the engine in accordance with the control program stored in flash memory 104 (step S102).

The steady process, i.e., a process which is executed in an ON-state of ignition key switch 130, is continuously executed until ignition key switch 130 is turned OFF (step S103) and is stopped when ignition key switch 130 is turned OFF (step S104).

Even after ignition key switch 130 is turned OFF, electronic control apparatus 101 holds an operating state thereof since the power is supplied thereto via self-shutoff relay switch 140.

Then, after performing a preparation for writing, into flash memory 104, the backup data, such as the learning data, the failure diagnosis information and the like, which was before written in RAM 103 during the steady process (step S105), electronic control apparatus 101 executes writing process (backup process) (step S106).

Incidentally, the writing process (backup process) includes erasing process for ensuring writable unused area.

Further, in the case where a plurality of storage areas for the backup data is set in flash memory 104, determination is made as to whether or not the writing of backup data at the previous time has been executed successfully (whether or not the previous writing of backup data is terminated without interruption), and when the previous writing has been executed successfully, the writing at the present time is executed on the area different from the previously written area.

As a result, even if the present writing of backup data is not executed successfully, the backup data written at the most recent time is able to be saved, and accordingly, it is possible to execute the steady process using the backup data saved in the recent-most time.

On the other hand, in the case where the previous writing has not been executed successfully, the present writing may be executed on the previously written area or on the area other than the area in which the backup data was written successfully in the recent-most time, so that it is possible to avoid the backup data successfully written in the latest time to be overwritten. Accordingly, even if the present writing is not executed successfully, it is possible to execute the steady process at the next starting using the backup data successfully written in the latest time.

Since there is a possibility that ignition key switch 130 is again turned ON during the writing process into flash memory 104, determination is made as to whether or not ignition key switch 130 is turned ON (step S107).

Here, if ignition key switch 130 is held in the ON state, determination is made as to whether or not the writing process into flash memory 104 was terminated (step S108), and if the writing process is not terminated, the writing process is continuously executed (step S106).

On the other hand, when the writing process into flash memory 104 was terminated while ignition key switch 130 is held in the OFF state, discrimination is made as to whether ignition key switch 130 is in the ON state or in the OFF state (step S109). If ignition key switch 130 is continuously held in the OFF state, self-shutoff relay switch 140 is turned OFF to self-shutoff the power supply (step S110), thereby shifting to the power supply shutoff state (step S100).

As a result, the backup data can be reliably saved in flash memory 104 without self-shutting off the power source before the writing of backup data is terminated.

On the other hand, if it is judged that ignition key switch 130 is in the ON state at the time when the writing process of the backup data in flash memory 104 is terminated, the steady process starts to be executed (step S102).

As a result, since it is possible to start the steady process immediately after the backup data writing process is terminated, the start of engine operation is not delayed, and further, an erroneous diagnosis by another electronic control apparatus 160 that electronic control apparatus 101 is abnormal due to the delay in starting the steady process in electronic control apparatus 101 is able to be avoided.

Further, if it is detected that ignition key switch 130 is turned ON before the writing process into flash memory 104 is terminated (step S107), the writing process is forcibly interrupted (step S111) and the steady process is started for being executed (step S102).

As a result, although the writing of backup data cannot be terminated, the steady process is started for being executed without delay in response to the ON operation of ignition key switch 130, so that the engine operation can be started in good response, and an erroneous diagnosis by another electronic control apparatus 160 that electronic control apparatus 101 is abnormal due to the delay in starting the steady process in electronic control apparatus 101 can be avoided.

As described in the above, when ignition key switch 130 is turned OFF, the writing of the backup data into flash memory 104 is executed, and the power supply comes to the self-shutoff thereof after the writing is terminated.

On the other hand, when ignition key switch 130 is again turned ON during the writing of backup data into flash memory 104, the steady process is started for being executed not by waiting the termination of the writing but by interrupting the writing at the time when ignition key switch 130 is turned ON.

By interrupting the writing of backup data, it is possible to immediately start execution of the steady process with the ON operation of ignition key switch 130. Therefore, the start of engine operation (the start of the steady process) takes place immediately following the key operation without any delay in time and also, another electronic control apparatus which is in communication with electronic control apparatus 101 can be prevented from making such an erroneous judgment that electronic control apparatus 101 is abnormal due to the delay in the start of the steady process.

However, if the writing is interrupted, there may be potential for adversely affecting the performance of the memory chip and there is also potential for doing incomplete writing. Therefore, as described above, it is preferable that the control of interrupting the writing at the time when ignition key switch 130 is turned ON to start execution of the steady process is utilized for the case where any adverse affect on the memory chip due to the writing interruption can be small and the written information may be incomplete.

When the execution of the steady process is started, judgment is made as to whether or not the previous writing of backup data has been executed successfully (whether or not the writing of backup data is terminated without interruption). If the previous writing has been executed successfully, the steady process is executed using the data previously written to flash memory 104, whereas if the previous writing has not been executed successfully, the steady process is executed using a default value previously stored in flash memory 104 or in the ROM.

The default value is such a value that is used at the time when any operation or setting is not performed at all, and is a set value beforehand incorporated in the apparatus in question and, if the default value is the learning data, it is an initial set value. Further, the initial set value is, for example, a design value, or a value set by the simulation, experimental tests conducted on an actual model of the apparatus or the like.

Thus, it is possible to avoid the steady process being executed based on abnormal data, when the writing is not executed successfully.

Further, as described above, in the case where the plural backup data storage areas are set in flash memory 104, the data is retrieved from the area on which the writing of backup data has been executed normally in the recent-most time, to be used for the steady process.

As a result, even if the writing of backup data is not executed successfully, the steady process can be executed based on the data obtained in the latest time, and even though a difference from the default value occurs by learning data or the like, the engine control performance can be maintained.

Figure 3:
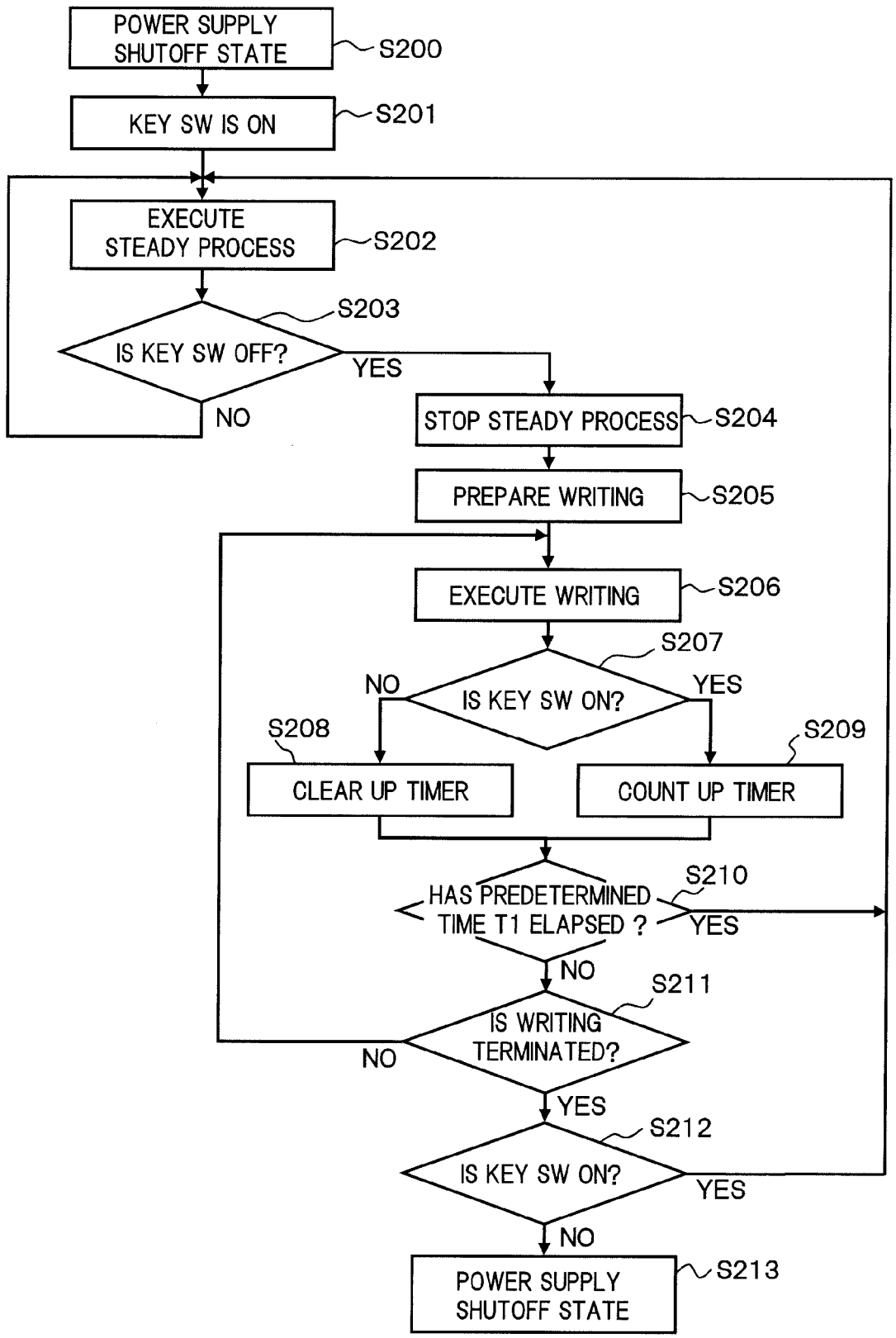
FIG. 3 is a flowchart showing a second embodiment of the backup process.

Next, there will be described a second embodiment in which the excessive delay in starting of the steady process can be avoided while reducing the adverse affection on the memory chip due to the writing interruption as much as possible, in accordance with a flowchart of FIG. 3.

In the state where ignition key switch 130 is turned OFF so that the power supply to electronic control apparatus 101 is stopped or in shutoff state (step S200), when ignition key switch 130 is turned ON so that the power is supplied to electronic control apparatus 101 (step S201), electronic control apparatus 101 executes the steady process in which controlling of the engine is performed in accordance with the control program stored in flash memory 104 (step S202).

The steady process is a process that is executed in the ON-state of ignition key switch 130, is continuously executed until ignition key switch 130 is turned OFF (step S203) and is stopped when ignition key switch 130 is turned OFF (step S204).

Even after ignition key switch 130 is turned OFF, electronic control apparatus 101 holds the operating state thereof since the power is supplied thereto via self-shutoff relay switch 140.

Then, after performing a preparation for writing into flash memory 104, the backup data, such as the learning data, the failure diagnosis information and the like, which is written in RAM 103 during the steady process (step S205), electronic control apparatus 101 executes the writing process (backup process) (step S206).

As described above, in the case where the plurality of storage areas for the backup data is set in flash memory 104, judgment is made as to whether or not the previous writing of backup data has been executed successfully (whether or not the previous writing of backup data is terminated without interruption), and when the previous writing has been executed successfully, the writing is executed on the area different from the previously written area.

As a result, even if the present writing of backup data is not executed successfully, the backup data written in the recent-most time is saved, and accordingly, it is possible to execute the steady process using the backup data saved in the most recent time.

On the other hand, in the case where the previous writing has not been executed successfully, the present writing may be executed on the previously written area or on the area other than the area in which the backup data is written successfully at the recent-most time, so that it is possible to avoid the backup data that was successfully written at the most recent time being overwritten. Accordingly, even if the present writing is not executed successfully, it is possible to execute the steady process at the next starting using the backup data successfully written in the recent-most time.

Here, if the area on which the previous writing has not been executed successfully is used as the area on which the present writing is to be executed, the unusable area in which the data is not saved normally is used in priority, and accordingly, limited areas can be availability used. However, when the writing is executed on the area in which the previous writing has not been executed successfully, it is desirable to perform in advance a chip diagnosis of the appropriate area.

Since there is a possibility that ignition key switch 130 is again turned ON during the writing process execution to flash memory 104, it is judged whether or not ignition key switch 130 is turned ON (step S207).

In the case where ignition key switch 130 is held in the ON state, a value of a timer is cleared up (step S208), whereas when ignition key switch is switched to the ON state, the counting up of the timer is started (step S209).

The value of the timer indicates a lapse of time after ignition key switch 130 is switched from the OFF state to the ON state. Accordingly, judgment is made based on the value of the timer whether or not a predetermined time T1 has elapsed after ignition key switch 130 was switched from the OFF state to the ON state (step S210).

In the case where the predetermined time T1 has elapsed after ignition key switch 130 was switched from the ON state to the OFF state, judgment is made that the starting of steady process cannot be further delayed, and then the writing process (backup process) is interrupted, so that the steady process is started for being executed (step S202).

When starting the execution of the steady process, judgment is made as to whether or not the previous backup data writing has been executed successfully (whether or not the backup data writing is terminated without interruption). If the previous writing has been executed successfully, the steady process is executed using the data previously written in flash memory 104, whereas if the previous writing has not been executed successfully, the steady process is executed using the default value (reference value) stored beforehand in flash memory 104 or in the ROM.

Thus, it is possible to avoid the steady process being executed based on the abnormal data, when the writing is not executed successfully.

Further, as described above, in the case where the plural backup data storage areas are set in flash memory 104, the data is retrieved from the area on which the writing of backup data has been executed normally in the recent-most time, to be used for the steady process.

As a result, even if the writing of backup data is not executed successfully, the steady process can be executed based on the data obtained in the recent-most time and the engine control performance can be maintained.

On the other hand, in the case where the predetermined time T1 has not elapsed after ignition key switch 130 was switched from the OFF state to the ON state, judgment is made that the writing process (backup process) can be continuously executed, and then judgment is made as to whether or not the writing process (backup process) is terminated (step 8211).

In the case where the writing process (backup process) is not terminated, since the predetermined time T1 after ignition key switch 130 was switched from the OFF state to the ON state has not yet elapsed, the writing process execution is allowed to continue (step S206).

When the writing process (backup process) is terminated, discrimination is made as to whether ignition key switch 130 is in the OFF state or in the ON state (step S212), and if ignition key switch 130 is held in the OFF state, the power supply is self-shutoff or stopped (step S213).

On the other hand, if ignition key switch 130 is turned ON approximately in synchronism with the termination of the writing process (backup process), the steady process is started for being executed without self-shutting off of the power source (step S202).

Figure 2:
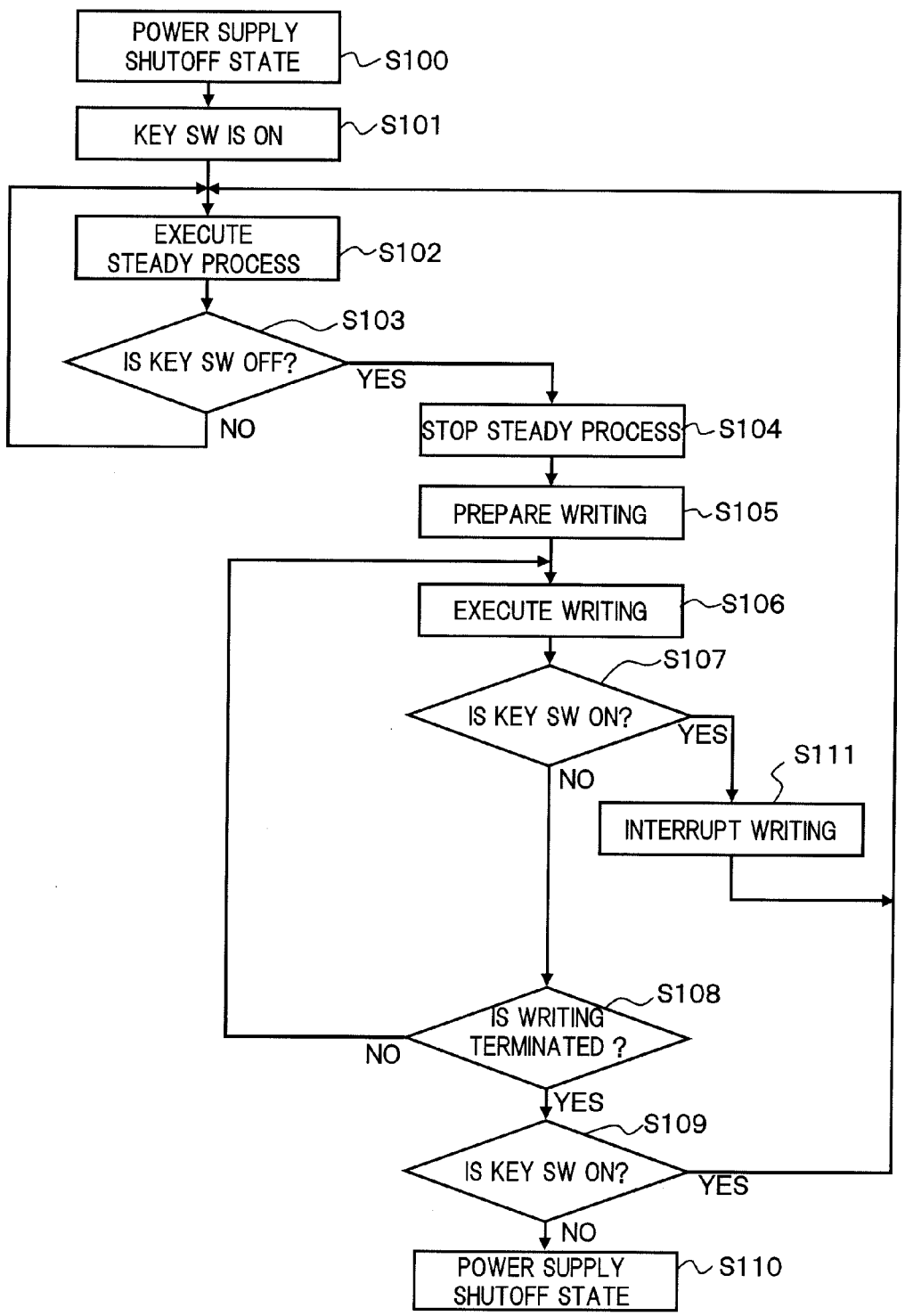
FIG. 2 is a flowchart showing a first embodiment of backup process.
Figure 4:
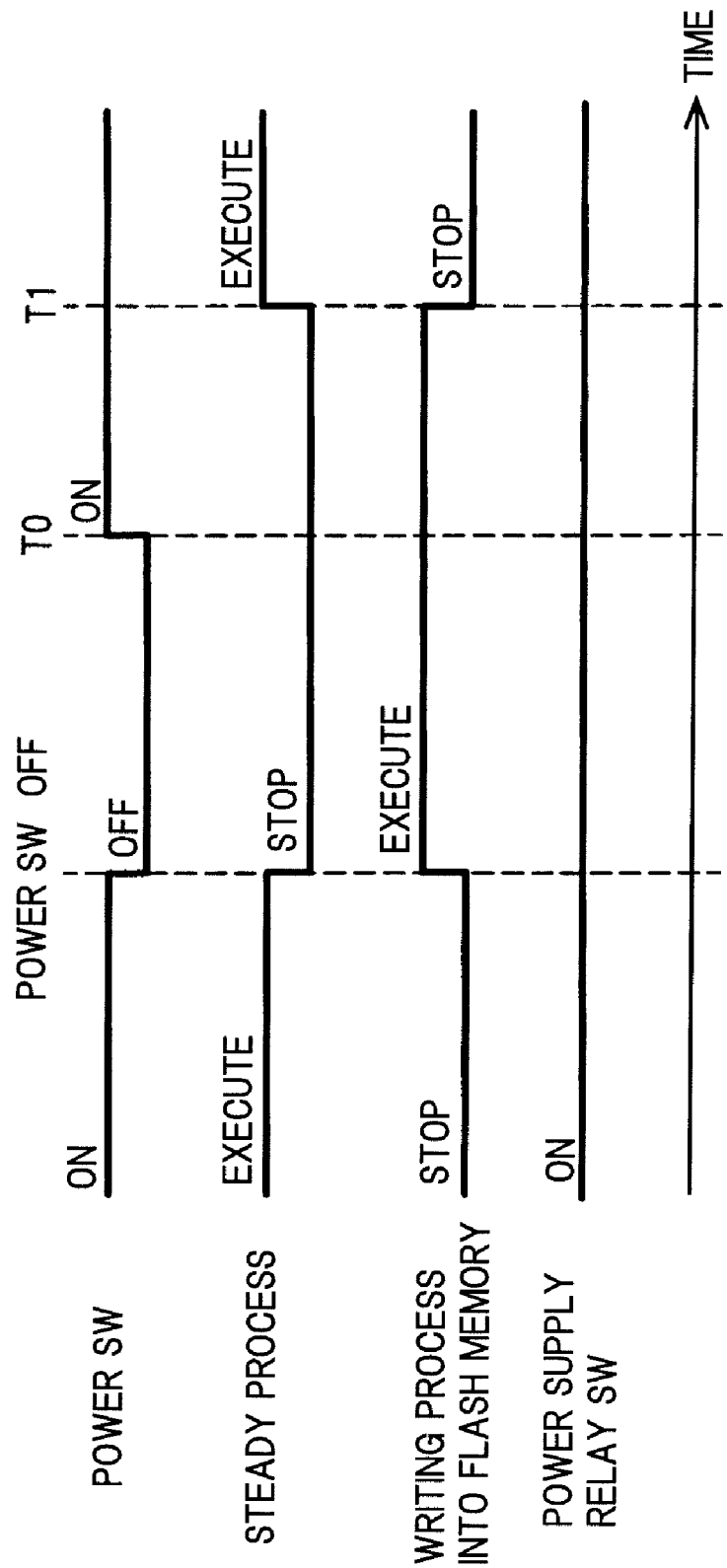
FIG. 4 is a time chart showing the case where the backup process is interrupted at the time when a predetermined time T1 has elapsed, and steady process is started for being executed.
Figure 5:
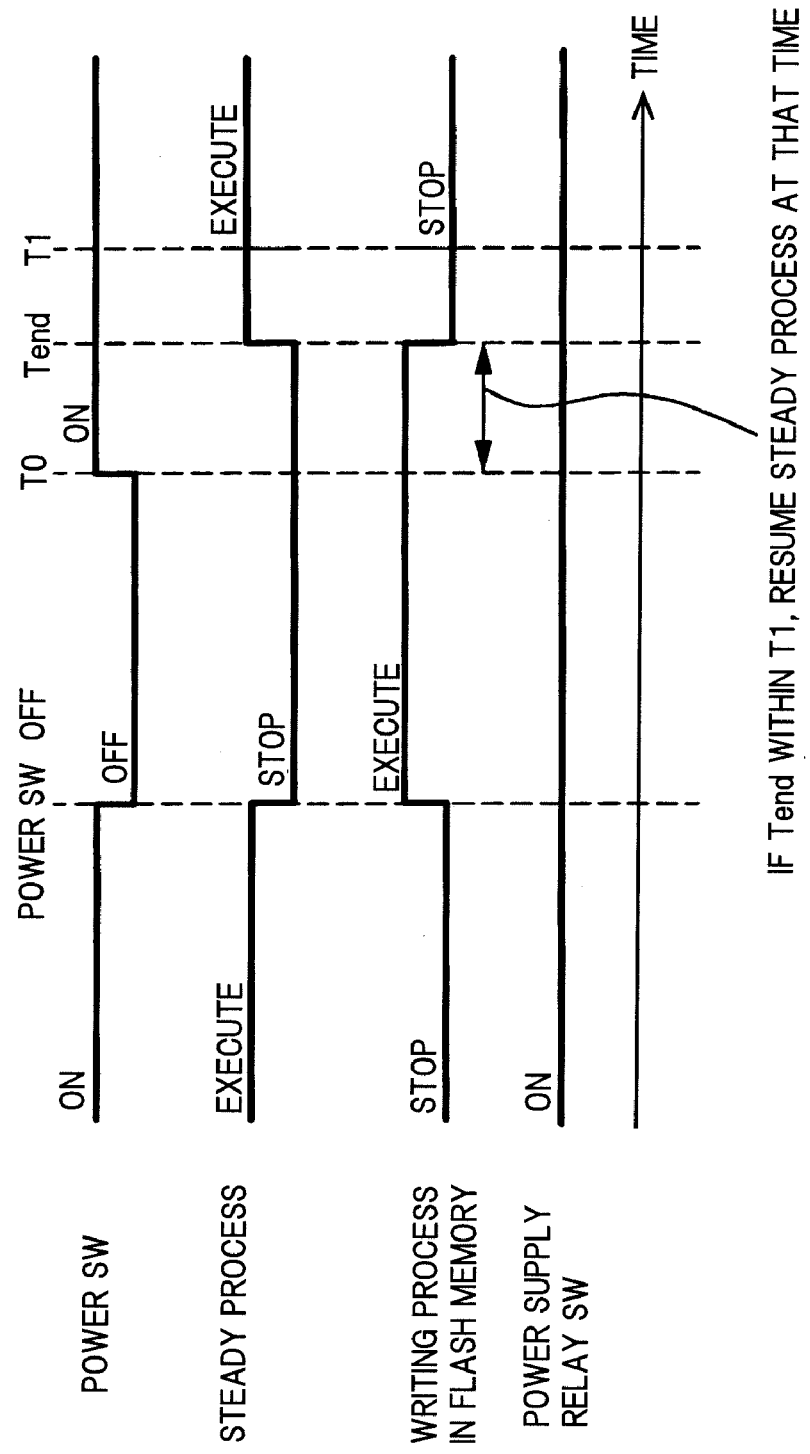
FIG. 5 is a time chart showing the case where the backup process is terminated before the predetermined time T1 has elapsed, and the steady process is started for being executed.

According to the above embodiment, even if ignition key switch 130 is again turned ON during the backup data writing process into flash memory 104, the writing process execution is allowed to continue for the predetermined time T1 after ignition key switch 130 is turned ON, and therefore, the probability of interruption of the writing process can be significantly lowered in comparison with that in the first embodiment shown in the flowchart of FIG. 2, and accordingly, any adverse affect on the memory chip due to the writing process interruption can be reduced as much as possible (refer to FIG. 4 and FIG. 5).

On the other hand, as shown in FIG. 4, in the case where the writing process is not terminated even though the predetermined time T1 has elapsed after ignition key switch 130 was turned ON, the steady process is immediately resumed. Therefore, even if the time required for the writing process is increased due to the chip degradation in flash memory 104 for example, the engine operation start (the steady process start) in response to the key operation is not excessively delayed, and further, it is possible to prevent another electronic control apparatus which is in communication with engine control apparatus 101 from making judgment of the delay in the start of the steady process as an occurrence of abnormality in electronic control apparatus 101.

Further, as shown in FIG. 5, in the case where the writing process is terminated before the predetermined time T1 has elapsed, since the steady process is started for being executed immediately after the writing process termination before the lapse of the predetermined time T1, the start of the steady process is not delayed unnecessarily.

Figure 6:
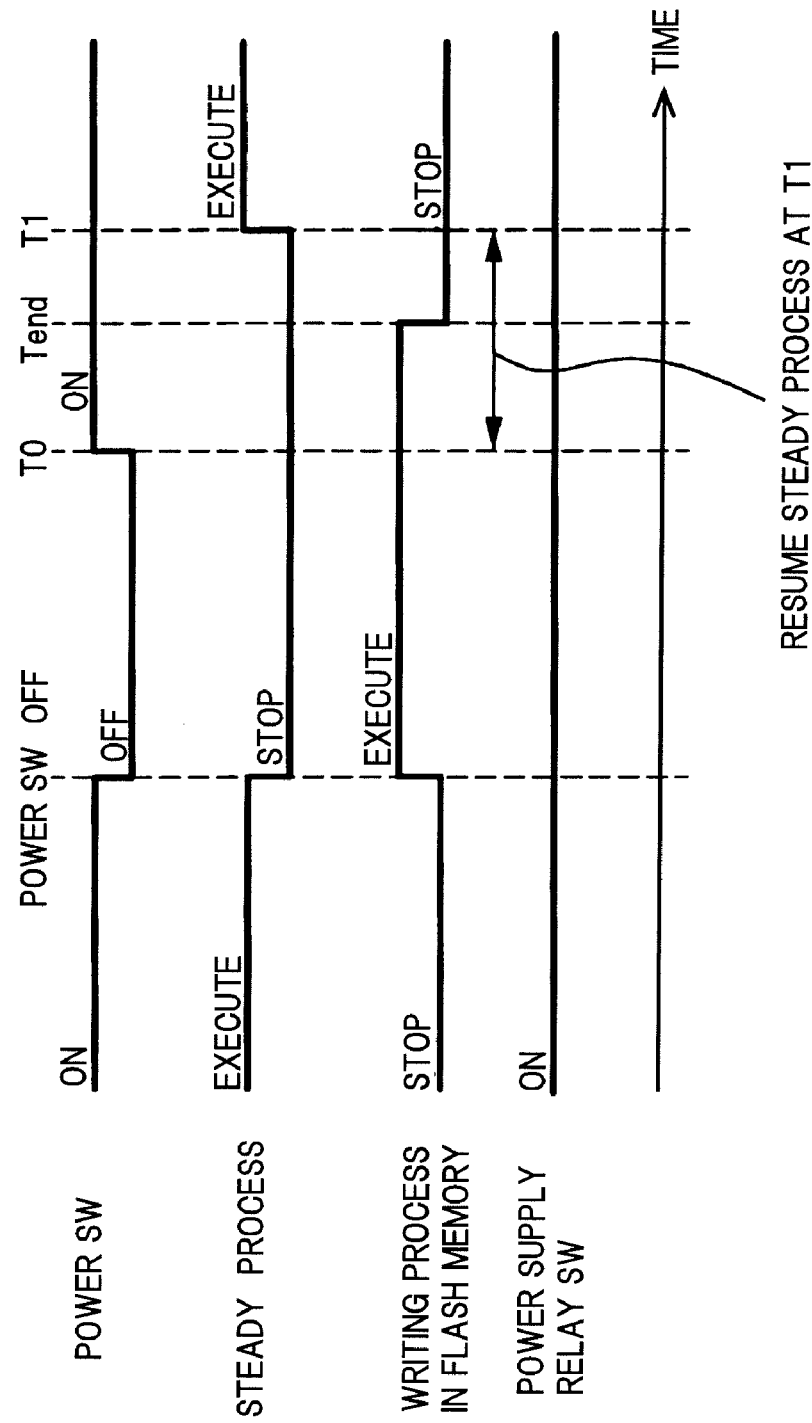
FIG. 6 is a time chart showing the case where the execution of the steady process is started after the predetermined time T1 has elapsed, even if the backup process is terminated before the predetermined time T1 has elapsed.

Incidentally, by fixing a time from when ignition key switch 130 is turned ON until when the steady process starts to be executed to the predetermined time T1, it is possible that, as shown in FIG. 6, even if the writing process is terminated before the lapse of the predetermined time T1, the steady process can start to be executed after the predetermined time T1 has elapsed.

Here, the predetermined time T1 is the remaining time obtained by subtracting a time required to actually start the steady process from the maximum allowable delay time from when ignition key switch 130 is turned ON until when the steady process is started for being executed.

The time required to actually start the steady process is the sum of the latency time for generating the reset input and a time required to execute resetting process (initializing process) before the execution of the steady process is started.

On the other hand, the maximum allowable delay time can be determined based on a window time from when ignition key switch 130 is turned ON until when another electronic control apparatus judges the abnormality in electronic control apparatus 101 due to that electronic control apparatus 101 does not start the communication with another electronic control apparatus, and further, can be determined based on a time when the driver feels discomfort due to that the steady process does not start to be executed after the ON operation of ignition key switch 130.

Further, it is possible to set the predetermined time T1 as a time within the maximum allowable delay time and a time obtained by "the learned time"+"the window time", by learning the time required to execute the backup data writing process.

The entire contents of Japanese Patent Application No. 2006-299531 filed on Nov. 2, 2006 and Japanese Patent Application No. 2007-249147 filed on Sep. 26, 2007, priorities of which are claimed, are incorporated herein by reference.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing description of the embodiments according to the present invention is provided for illustration only, and not for the purpose of limiting the invention as defined by the appended claims and their equivalents.

We claim:

1. An electronic control apparatus connected to an another electronic control apparatus via a communication line, in which the another electronic control apparatus judges that an abnormality occurs in the electronic control apparatus in the case in which a time from when the power switch is turned ON until when a steady process is started for being executed in the electronic control apparatus exceeds a threshold, comprising:

a rewritable non-volatile memory;

a writing section that executes writing of backup data into the rewritable nonvolatile memory during self-shutoff process after a power switch is turned OFF; and a steady process resuming section that resumes steady process to be executed corresponding to an ON-state of the power switch, when the power switch is again turned ON during the writing of the backup data into the memory by the writing section and when the writing of the backup data is not terminated before elapse of a predetermined time from an instant when the power switch is again turned ON, the steady process resuming section setting a time shorter than the threshold as the predetermined time.

2. The electronic control apparatus according to claim 1, further comprising; a default value providing section that provides a default value as data to be treated as target for backup at a next starting time, when the writing of the backup data is not terminated during the self-shutoff process.

3. The electronic control apparatus according to claim 1, wherein the rewritable nonvolatile memory is provided with a plurality of storage areas for the backup data, and the electronic control apparatus further comprises a backup data reading section that reads the recent-most value of the successfully written backup data at a next starting time, when the backup data writing is not terminated during the self-shutoff process.

4. The electronic control apparatus according to claim 1, wherein the rewritable nonvolatile memory is provided with a plurality of storage areas for the backup data, and the writing section executes next writing of the backup data on an area on which previous writing has not been executed successfully, when the writing of the backup data is not terminated during the self-shutoff process.

5. The electronic control apparatus according to claim 1, wherein the rewritable nonvolatile memory is provided with a plurality of storage areas for the backup data, and the writing section executes next writing of the backup data on an area other than a newest area on which the writing of the backup data has been executed successfully, when the writing of the backup data is not terminated during the self-shutoff process.

6. The electronic control apparatus according to claim 1, wherein the steady process resuming section learns a time required by the writing section for writing the backup data, and sets the predetermined time based on a result of learning.

7. The electronic control apparatus according to claim 1, wherein the electronic control apparatus comprises a unit for controlling a vehicle engine, and the power switch comprises an ignition key switch.

8. An electronic control apparatus connected to an another electronic control apparatus via a communication line, in which the another electronic control apparatus judges that an abnormality occurs in the electronic control apparatus in the case in which a time from when the power switch is turned ON until when the steady process is started for being executed in the electronic control apparatus exceeds a threshold, comprising:

a rewritable nonvolatile memory;

a writing means that executes writing of backup data into the rewritable nonvolatile memory during self-shutoff process after a power switch is turned OFF; and a steady process resuming means that resumes steady process to be executed corresponding to an ON-state of the power switch, when the power switch is again turned ON during the writing of the backup data into the memory by the writing means writing section and when the writing of the backup data is not terminated before elapse of a predetermined time from an instant when the power switch is again turned ON, the steady process resuming means setting a time shorter than the threshold as the predetermined time.

9. A writing method of backup data in an electronic control apparatus having a rewritable nonvolatile memory, in which an another electronic control apparatus in communication with the electronic control apparatus via a communication line judges that an abnormality occurs in the electronic control apparatus in the case in which a time from when the power switch is turned ON until when a steady process is started for being executed in the electronic control apparatus exceeds a threshold, comprising the steps of:

executing writing of backup data in the memory during the self-shutoff process after a power switch is turned OFF;

measuring an elapsed time from an instant when the power switch was again turned ON during the writing of the backup data in the memory;

resuming the steady process to be executed corresponding to the ON-state of the power switch when the writing of the backup data is not terminated at the time when the elapsed time reaches a predetermined time; and setting a time shorter than the threshold as the predetermined time.

10. The method according to claim 9, further comprising the step of, providing a default value as data to be treated as target for backup at next starting time, when the writing of the backup data is not terminated during the self-shutoff process.

11. The method according to claim 9, wherein the rewritable nonvolatile memory is provided with a plurality of storage areas for the backup data, the method further comprises the step of, reading a recent-most value of the successfully written backup data at the next starting time, when the writing of the backup data is not terminated during the self-shutoff process.

12. The method according to claim 9, wherein the rewritable nonvolatile memory is provided with a plurality of storage areas for the backup data, and wherein the step of executing the writing of the backup data comprises the step of:

executing the writing of the next backup data to an area on which previous writing has not been executed successfully, when the writing of the backup data is not terminated during the self-shutoff process.

13. The method according to claim 9, wherein the rewritable nonvolatile memory is provided with a plurality of storage areas for the backup data, and wherein the step of executing the writing of the backup data comprises the step of:

executing the next writing of the backup data to an area other than a newest area in which the backup data writing has been executed successfully, when the writing of the backup data is not terminated during the self-shutoff process.

14. The method according to claim 9, wherein the step of resuming the steady process comprises the steps of: learning a time required for writing the backup data; and setting the predetermined time based on a result of the learning.

15. The method according to claim 9, wherein the electronic control apparatus comprises a unit for controlling a vehicle engine, and the power switch comprises an ignition key switch.

* * * * *